US009995789B2

(12) United States Patent
Dewan et al.

(10) Patent No.: US 9,995,789 B2
(45) Date of Patent: Jun. 12, 2018

(54) SECURE REMOTE DEBUGGING OF SOCS

(71) Applicant: Intel IP Corporation, Santa Clara, CA (US)

(72) Inventors: Prashant Dewan, Portland, OR (US); Siddhartha Chhabra, Hillsboro, OR (US)

(73) Assignee: Intel IP Corporation, Santa Clara, CA (US)

( * ) Notice: Subject to any disclaimer, the term of this patent is extended or adjusted under 35 U.S.C. 154(b) by 182 days.

(21) Appl. No.: 14/977,998

(22) Filed: Dec. 22, 2015

(65) Prior Publication Data
US 2017/0176524 A1    Jun. 22, 2017

(51) Int. Cl.
| G06F 11/00 | (2006.01) |
| G01R 31/3177 | (2006.01) |
| G01R 31/317 | (2006.01) |
| G06F 11/36 | (2006.01) |

(52) U.S. Cl.
CPC ..... *G01R 31/3177* (2013.01); *G01R 31/3172* (2013.01); *G06F 11/3656* (2013.01); *G06F 11/3664* (2013.01)

(58) Field of Classification Search
CPC ............ G01R 31/3172; G01R 31/3177; G06F 11/3656; G06F 11/3664
See application file for complete search history.

(56) References Cited

U.S. PATENT DOCUMENTS

| 7,496,818 | B1 * | 2/2009 | Azimi | G01R 31/31705 |
| | | | | 341/100 |
| 8,595,555 | B1 | 11/2013 | Taylor | |
| 9,606,175 | B2 * | 3/2017 | Trethewey | G01R 31/3177 |
| 2003/0100133 | A1 * | 5/2003 | Eidson | G06F 11/3664 |
| | | | | 438/16 |
| 2009/0254886 | A1 * | 10/2009 | Elliot | G06F 11/3656 |
| | | | | 717/125 |
| 2013/0212425 | A1 | 8/2013 | Blaine et al. | |
| 2014/0013145 | A1 * | 1/2014 | Hopkins | G06F 1/3206 |
| | | | | 713/330 |
| 2014/0331064 | A1 * | 11/2014 | Ballesteros | G06F 12/1408 |
| | | | | 713/193 |
| 2015/0161408 | A1 | 6/2015 | Shanbhogue et al. | |

(Continued)

FOREIGN PATENT DOCUMENTS

WO    WO-2015153562 A1    10/2015

OTHER PUBLICATIONS

"International Application Serial No. PCT/US2016/061135, International Search Report dated Feb. 22, 2017", 3 pgs.

(Continued)

*Primary Examiner* — Joshua P Lottich
(74) *Attorney, Agent, or Firm* — Schwegman Lundberg & Woessner, P.A.

(57) ABSTRACT

Techniques for secure remote debugging of SoCs are described. The SoC includes an intellectual property (IP) block, a microcontroller, and a fabric coupled to the IP block and the microcontroller. The IP block transmits, via the fabric, information regarding events within the IP block to the microcontroller. The microcontroller executes firmware including a network stack and a remote debugger program. Using the firmware, the microcontroller provides the event information to a device external to the SoC.

23 Claims, 4 Drawing Sheets

(56) References Cited

U.S. PATENT DOCUMENTS

| | | |
|---|---|---|
| 2015/0169495 A1 | 6/2015 | Zheng |
| 2015/0226795 A1* | 8/2015 | Hopkins .......... G01R 31/31705 714/726 |
| 2015/0268302 A1* | 9/2015 | Hopkins .......... G01R 31/31705 714/724 |
| 2016/0110275 A1* | 4/2016 | Michalovich ....... G06F 11/3656 714/43 |
| 2017/0115344 A1* | 4/2017 | Kuehnis ............. G01R 31/3177 |
| 2017/0115350 A1* | 4/2017 | Zhang .............. G01R 31/31705 |

OTHER PUBLICATIONS

"International Application Serial No. PCT/US2016/061135, Written Opinion dated Feb. 22, 2017", 9 pgs.

\* cited by examiner

SECURE REMOTE DEBUGGING OF SOCS

TECHNICAL FIELD

The present disclosure relates generally to system-on-a-chip (SoC) implementations; and specifically to secure remote debugging of SoCs.

BACKGROUND

An SoC is an integrated circuit (IC) that includes a number of computer components on a single chip substrate. An SoC may include any number of component blocks (e.g., intellectual property blocks or IP blocks) that perform a function, such as graphics processing, memory management, general or special-purpose processing, etc. The SoC may also include a fabric to connect the various IP blocks with each other intra-chip communication) or with components external to the SoC (e.g., inter-chip communications) via an interconnect (e.g., bus).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments or examples discussed in the present document.

DETAILED DESCRIPTION

The present disclosure describes methods, systems, and computer program products that individually facilitate secure remote debugging of SoCs.

With the emerging dominance of the SoCs in the market, SoC platforms are becoming sophisticated and comprehensive platforms comprising a large number of IP blocks ranging from video/audio/image processing, to myriad number of sensors, to the low-level general purpose processors and input-output interfaces. Fixed-function and programmable IP blocks enable manufacturers to provide differentiation in the marketplace while reducing manufacturing costs.

Unlike general processors, no two SoCs are the same; each SoC has unique thermal properties, fuse controller properties, etc. An SoC vendor/manufacturer may need to debug an SoC that has already shipped to the customer, such as an original equipment manufacturer (OEM). Some SoCs have security restrictions to prevent certain debugging procedures from being executed by anyone other than the SoC vendor.

Until an SoC has completely booted, the only way to debug the SoC is by using special equipment, such as JTAG equipment to access the Test Access Port (TAP) through the HAG registers of the SoC. Joint Test Action Group (JTAG) refers to the IEEE 1149.1 standard, Standard Test Access Port and Boundary-Scan Architecture for test access ports used for testing printed circuit boards using boundary scans. However, debugging using special equipment requires not only the special equipment, but also requires an engineer hired by the SoC vendor to have physical access to the SoC; this may become extremely expensive. SoC vendors spend millions of dollars each year in debugging SoCs that are already "in the field" (e.g., no longer under the physical control of the SoC vendor).

Furthermore, to remotely debug SoCs that are currently available, the main processor of the SoC itself must execute debugging software; if the SoC platform has a problem and has failed to boot, remote debugging of the SoC platform is not possible. If the SoC platform successfully boots but is infected by malware, which suppresses notification of events to anti-virus or debugging software, debugging using software executing on the main processor may not uncover the suppressed events.

In some embodiments disclosed herein, an SoC uses a microcontroller to allow a user (e.g., a test engineer hired by the SoC vendor) to log into the SoC remotely, access the TAP of various IP blocks in the SoC, and debug the SoC using a virtual JTAG, even when the operating system of the SoC does not boot, or if malware executing on the main processor is suppressing anti-virus software. The microcontroller receives and records events (e.g., exceptions, traps, faults, etc.) from the main processor of the SoC via a hardware fabric that is internal to the SoC, thus enabling remote debugging/monitoring of the SoC. Software executing in an IP block cannot prevent the physical connection (e.g., the fabric) between the IP block and the microcontroller, nor may software transmit data over this physical connection; thus, even if the SoC has been infected by malware, the malware will not be able to prevent the microcontroller from receiving events from the main processor or any other IP block within the SoC.

The microcontroller may also receive and record events from other IP blocks within the SoC, and may also enable remote debugging of individual IP blocks within the SoC. In some embodiments, the microcontroller has a network stack, allowing the microcontroller to (1) send events to a (remote) network entity that may (remotely) monitor the SoC, or (2) respond to debugging commands from a (remote) network entity.

In some embodiments, the microcontroller also allows the platform functionality to be changed remotely by burning one or more Field Programmable Fuses (FPFs) within the SoC. Functionality may be added to or removed from the SoC by burning one or more fuses within the SoC. For example, each feature/service may have a corresponding fuse; when the microcontroller firmware boots, the firmware reads the fuses and exposes only those features/services whose corresponding fuse has NOT been blown. The terms "burning," "blowing out," and "self-destruct" indicate either a force external to a fuse causing the fuse to be destroyed or the fuse causing itself to be destroyed.

Once a fuse is blown, that fuse cannot be restored. However, a bijection (i.e., a one-to-one correspondence) between a fuse and a feature/service is not the only option; the SoC may be manufactured in various fuse-feature configurations. For example, each feature/service may be associated with a corresponding set of fuses. A fuse set has a quantity (e.g., cardinality) of operational (e.g., not destroyed) fuses in the set, and the quantity has a parity (e.g., an "even" parity if the quantity is even, or an "odd" parity if the quantity is odd). The firmware of the microcontroller may be set in such a way as to enable a feature/service if in the parity of the corresponding fuse set is odd and to disable the feature/service if the parity of the corresponding fuse set is even (or vice versa). A finite number of fuses exist within an SoC; thus, switching between enabling and disabling a feature/service may only be done a finite number of times.

Figure 1:
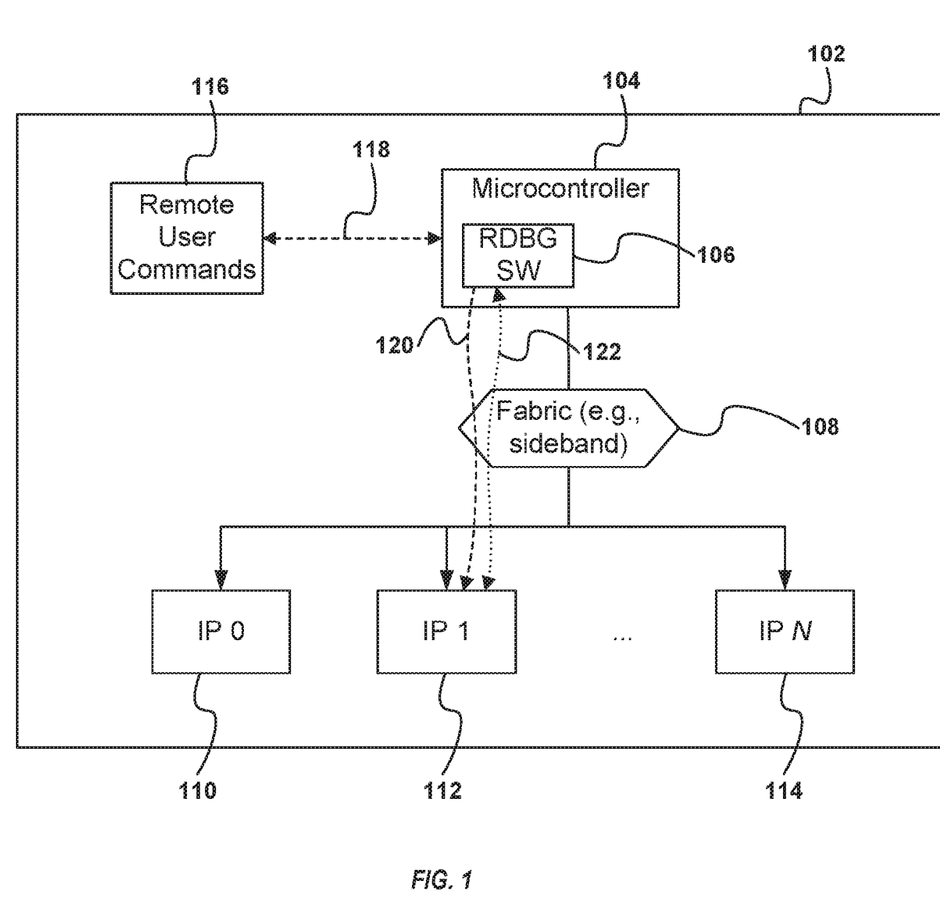
FIG. 1 illustrates an example SoC that enables secure remote debugging, according to an embodiment.

FIG. 1 illustrates an example SoC 102 that enables secure remote debugging, according to an embodiment. The example SoC 102 includes a microcontroller 104, which executes firmware and is the first entity within the SoC 102 to boot when the SoC 102 is booted. The firmware of the microcontroller 104 includes a network stack, which allows the microcontroller 104 to communicate with external devices. In some embodiments, the microcontroller 104 is the interface between the SoC 102 and the outside world. The firmware of the microcontroller 104 also executes remote debugging software 106, which includes an interface that allows a remote user to debug the SoC 102 by issuing commands. In some embodiments, the remote debugging software 106 is loaded from local non-volatile storage.

Example SoC 102 includes IP blocks IP0 110, IP1 112, . . . , IPN 114. An IP block may be of varying types, including general-purpose processors (e.g., in-order or out-of-order cores), fixed function units, graphics processors/engines, I/O controllers, display controllers, media processors, modems, network interface devices, etc. In some embodiments, IP0 110 is a general-purpose processor and the other IP blocks are special-purpose devices.

The microcontroller 104 and the IP blocks 110, 112, . . . , 114 are connected to each other via a "fabric" 108, which is a hardware interconnect within the example SoC 102. A fabric 108 may be a "primary" fabric, which may be used for any "in-band communication" (e.g., memory, input/output (I/O), configuration, in-band messaging, etc.) between IP blocks, or a "sideband" fabric, which may be used for out-of-band communication (e.g., commands, statuses, interrupts, power management, fuse distribution, configuration shadowing, test modes, etc.) between IP blocks. In some embodiments, an SoC 102 has only a primary fabric; in other embodiments, an SoC 102 has both a primary fabric and a sideband fabric. In some embodiments, a sideband fabric is a routed "network" within the SoC 102, where each interface has a unique ID derived from its location in the SoC 102. The unique ID of an interface of an IP block is used to route transmissions to/from the IP block within the sideband fabric 108. Sideband fabrics (also known as "sideband networks") are used in some SoCs from Intel® and ARM®.

Each IP block 110, 112, . . . , 114 within SoC 102 has both a "master" interface and a "slave" interface. The master interface is used by an IP block when that IP block sends a packet on the fabric 108, whereas the slave interface is used by an IP block when that IP block receives a packet on the fabric 108. In some embodiments, each IP block has its own master signals and slave signals. An IP block's master interface sends packets on the fabric and the slave interface exposes registers for other IP blocks to read/write. Together, an IP block's master and slave interfaces are referred to as the IP block's "virtual test access port" (vTAP). A vTAP also includes a decoder, which decodes packets received by the slave interface. The microcontroller 104 may access an IP block's vTAP via the fabric 108.

In an embodiment, IP1 112 is a general-purpose processor (e.g., a CPU), which exposes both primary and sideband interfaces to the fabric 108. The IP1 112 microcode injects instructions into the pipeline within IP1 112 and may read the IP1 112 pipeline state (e.g., command registers, memory, instruction registers, program counters, general-purpose registers, exception states, interrupt controller registers, etc.). The IP1 112 exposes the IP1 112 pipeline state to JTAG by entering into "probe mode," which is a mode or state of the IP1 112 in which test instructions or code may be executed to test the IP1 112. After testing of the IP1 112 is complete, the IP1 112 exits probe mode and may resume normal operation.

The microcontroller 104 receives 118 commands 116 from a remote user; the microcontroller 104 then sends 120 the remote user commands 116 to the vTAP of IP1 112. The microcode of IP1 112 "executes" these remote user commands 116 on the pipeline within IP1 112. After execution of every instruction, the microcode of IP1 112 reads the values in various state registers. The IP1 112 microcode then provides 122 these values, through the vTAP of IP1 112, to the remote debugging software 106. Using this mechanism, the remote debugging software 106 may be used to set break points on the IP1 112, inject interrupts, inject exceptions, monitor model-specific registers, monitor performance counters, set thermal limits, etc.

The commands available between the microcontroller 104 and the IN 112 is derived from the instruction set architecture (ISA) exposed by the IP1 112 to general-purpose software. For example, in an embodiment where IP1 112 is an Intel® x86 CPU, the "INT" x86 instruction exposed by IP1 112 has a corresponding command for the microcontroller 104 to issue. In some embodiments, the microcontroller 104 may also issue a command to set a breakpoint register in the IP1 112.

Embodiments are not limited to the remote debugging of general-purpose CPUs; other IP blocks may also be remotely debugged using the disclosed embodiments. For example, the disclosed embodiments may be used with a graphics IP block. A graphics IP block generally executes as follows: (1) the graphics IP block reads commands from memory and executes them; (2) kernel ("ring 0") software sets up the memory state and points the program counter (PC) of the graphics IP block to point to the appropriate location in memory; and (3) the graphics IP block then renders the bitmaps and writes back to memory. The microcontroller 104 firmware sets the graphics state by writing to shared memory between the graphics IP block and the microcontroller 104 and writes to the graphics registers through the sideband fabric 108. The microcontroller 104 may also use the vTAP of the graphics IP block to read the internal graphics registers by issuing vTAP commands through the sideband fabric 108.

In some embodiments, the microcontroller 104 may issue commands for multiple vTAPs simultaneously; thus, the microcontroller 104 may be used to debug complex scenarios involving multiple IP blocks.

Figure 2:
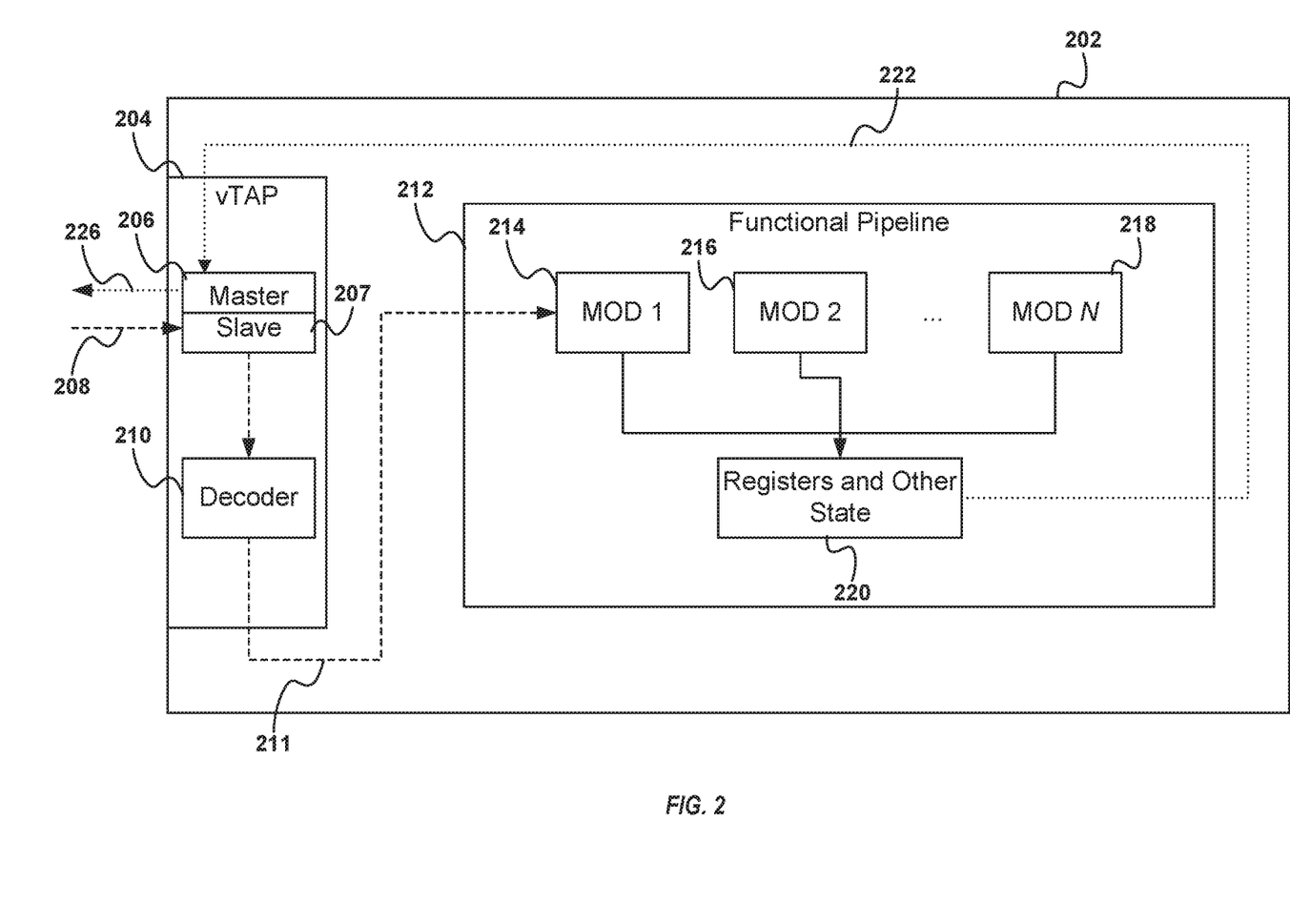
FIG. 2 illustrates an example IP block within an example SoC that enables secure remote debugging, according to an embodiment.

FIG. 2 illustrates an example IP block 202 within an SoC 102 that enables secure remote debugging, according to an embodiment. Example IP block 202 may be any IP block 110, 112, . . . , 114 as illustrated in FIG. 1, and may be a general-purpose processor (e.g., in-order or out-of-order core), a fixed function unit, a graphics processor/engine, an I/O controller, a display controller, a media processor, a modem, a network interface device, etc. Example IP block 202 comprises a vTAP 204 and a functional pipeline 212.

vTAP 204 comprises master interface 206 and slave interface 207. As described above, the slave interface 207 receives 208 packets from the fabric 108, and the master 206 interface transmits 226 packets onto fabric 108. Specifically, the slave interface 207 is used by IP block 202 to receive commands from the remote debugging software 106 over the sideband fabric 108, and the master interface 206 is used by IP block 202 to transmit responses generated by the functional pipeline 212 in response to the commands from the remote debugging software 106.

vTAP 204 receives 208 a command and using decoder 210 decodes the command into an instruction/command that the functional pipeline 212 of IP block 202 understands (e.g., an x86 instruction, a read/write from a register, etc.). The decoder 210 then sends the decoded instruction/command to the functional pipeline 212 for processing.

The logic of IP block 202 is illustrated in FIG. 2 as functional pipeline 212, which is a generic pipeline of modules 214, 216, . . . , 218, and does not represent the processing pipeline of any particular IP block 202. The functional pipeline 212 executes the decoded instruction/command, and will update the registers and other state 220 as a result of this execution. After the execution of the instruction/command is complete, the vTAP 204 reads 222 the registers and other state 220 and generates a response back to the remote debugging software 106. The master interface 206 transmits 226 the generated response to the microcontroller 104 via the sideband fabric 108.

Figure 3:
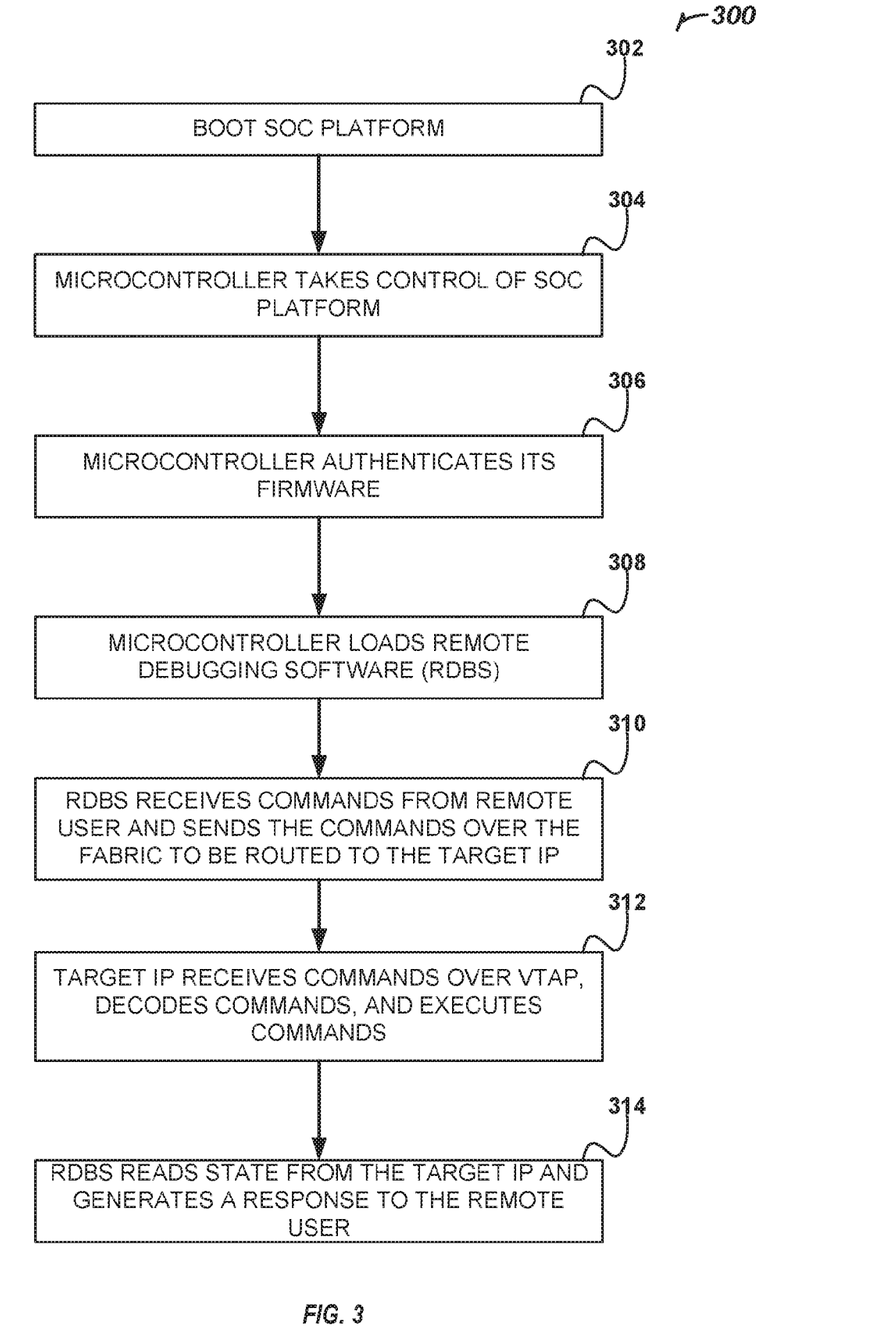
FIG. 3 is a flowchart illustrating operations of an example SoC that enables secure remote debugging, according to an embodiment.

FIG. 3 is a flowchart 300 illustrating operations of an example SoC 102 that enables secure remote debugging, according to an embodiment.

The SoC 102 platform begins by booting up (operation 302).

The microcontroller 104 takes control of the SoC 102 platform (operation 304).

The microcontroller 104 authenticates its own firmware (operation 306). In some embodiments, a cryptographic (e.g., RSA) key is printed inside a fuse. Using the cryptographic key, the microcontroller 104 authenticates its own software.

The microcontroller 104 loads the remote debugging software 106 (operation 308).

The remote debugging software 106 receives 118 commands 116 from a remote user (e.g., an SoC test engineer) and sends the commands 120 over the fabric 108 to be routed to the target IP block 202 (operation 310).

The target IP block 202 receives the commands over its vTAP 204, decodes the commands using decoder 210, and executes the decoded commands using functional pipeline 212 (operation 312).

The remote debugging software 106 reads 122 state from the target IP block 202 and generates a response to the remote user (operation 314).

Figure 4:
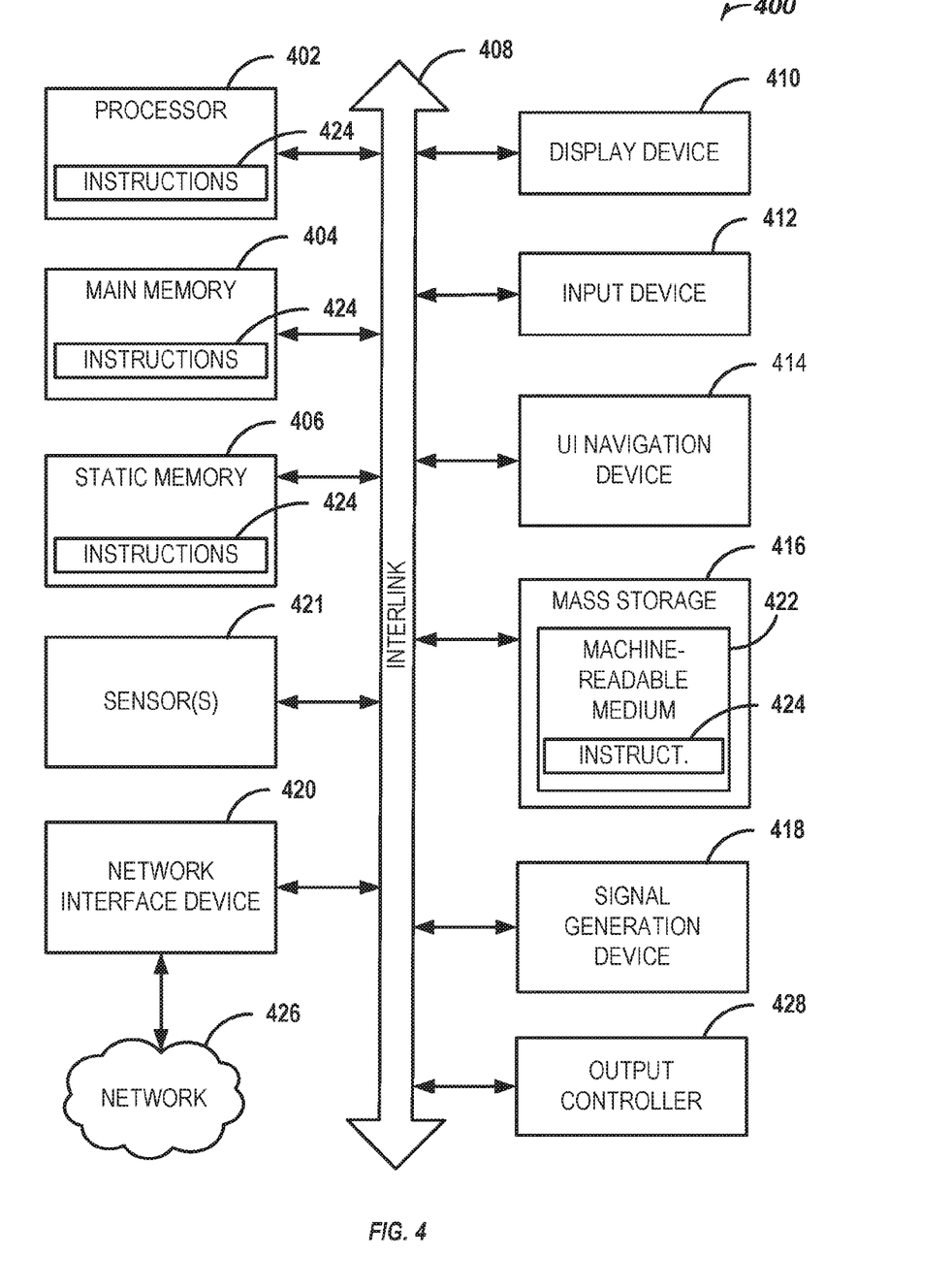
FIG. 4, is a block diagram illustrating an example of a machine, upon which any one or more embodiments may be implemented.

FIG. 4 is a block diagram illustrating an example of a machine 400, upon which any one or more embodiments may be implemented. In alternative embodiments, the machine 400 may operate as a standalone device or may be connected (e.g., networked) to other machines. In a networked deployment, the machine 400 may operate in the capacity of a server machine, a client machine, or both in a client-server network environment. In an example, the machine 400 may act as a peer machine in a peer-to-peer (P2P) (or other distributed) network environment. The machine 400 may implement or include any portion of the systems, devices, or methods illustrated in FIGS. 1-3, and may be a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, although only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations, etc.

Examples, as described herein, may include, or may operate by, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 400 may include a hardware processor 402 (e.g., a central processing unit (CPU), a graphics processing unit (GPU), a hardware processor core, or any combination thereof), a main memory 404 and a static memory 406, some or all of which may communicate with each other via an interlink (e.g., bus) 408. The machine 400 may further include a display unit 410, an alphanumeric input device 412 (e.g., a keyboard), and a user interface (UI) navigation device 414 (e.g., a mouse). In an example, the display unit 410, input device 412 and navigation device 414 may be a touch screen display. The machine 400 may additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The machine 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.)

The storage device 416 may include a machine-readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 may constitute machine-readable media.

Although the machine-readable medium 422 is illustrated as a single medium, the term "machine-readable medium" may include a single medium or multiple media (e.g., a centralized or distributed database, and/or associated caches and servers) configured to store the one or more instructions 424.

The term "machine-readable medium" may include any medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine-readable medium examples may include solid-state memories, and optical and magnetic media. Accordingly, machine-readable media are not transitory propagating signals. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). The term "transmission medium" shall be taken to include any intangible medium that is capable of storing, encoding or carrying instructions for execution by the machine 400, and includes digital or analog communications signals or other intangible medium to facilitate communication of such software.

Additional Notes & Example Embodiments

Each of these non-limiting examples can stand on its own, or can be combined in various permutations or combinations with one or more of the other examples.

Example 1 is a system on a chip (SoC), comprising: an intellectual property (IP) block to produce an event; a microcontroller to execute firmware comprising a network stack and a remote debugger program; and a fabric coupled to the microcontroller and the IP block; wherein the TIP block is to transmit, over the fabric, information about the produced event to the microcontroller; and wherein the microcontroller is to use the network stack and the remote debugger program to provide the information about the produced event to a device external to the SoC.

In Example 2, the subject matter of Example 1 optionally includes, wherein the IP block is a processor.

In Example 3, the subject matter of any one or more of Examples 1-2 optionally include, wherein the fabric is a sideband fabric.

In Example 4, the subject matter of any one or more of Examples 1-3 optionally include, wherein the IP block comprises: a virtual test access port (vTAP); and a functional pipeline comprising: a hardware processing module; and a register.

In Example 5, the subject matter of Example 4 optionally includes, wherein the vTAP comprises: a slave interface coupled to the fabric; a master interface coupled to the fabric and to the functional pipeline; and a decoder coupled to the slave interface and to the functional pipeline; wherein the slave interface is to: receive a command from the microcontroller via the fabric; and transfer the command to the decoder; wherein the decoder is to: decode the command; and transfer the decoded command to the functional pipeline; wherein the functional pipeline is to: execute the decoded command using the hardware processing module; and update the register in response to the execution of the decoded command; and wherein the maker interface is to: read contents of the register; generate, based on the contents of the register; a response to the received command; and transmit the generated response to the microcontroller via the fabric.

In Example 6, the subject matter of Example 5 optionally includes, wherein the microcontroller is to receive, via the remote debugger program and the network stack, the command from the device external to the SoC.

In Example 7, the subject matter of Example 6 optionally includes: a non-volatile memory, wherein the microcontroller is to record into the non-volatile memory: the command received from the external device; and the generated response corresponding to the received command.

In Example 8, the subject matter of any one or more of Examples 1-7 optionally include, further comprising: a plurality of field-programmable fuses (FPFs), wherein the microcontroller is to destroy a respective FPF in the plurality of FPFs in response to a corresponding command received by the microcontroller from the device external to the SoC; wherein a respective FPF in the plurality of FPFs corresponds to a respective computing service offered by the SoC; and wherein the SoC is to provide the respective computing service if the respective FPF is not destroyed.

In Example 9, the subject matter of Example 8 optionally includes, wherein a subset of FPFs in the plurality of FPFs corresponds to a computing service offered by the SoC, wherein the subset of FPFs has a cardinality of operational fuses, and wherein the cardinality has a parity; and wherein the SoC is to provide the computing service only if the parity of the cardinality of the FPF subset is odd.

In Example 10, the subject matter of any one or more of Examples 1-9 optionally include, further comprising: a cryptographic key; wherein the microcontroller is to use the cryptographic key to authenticate the firmware prior to execution of the firmware.

Example 11 is a method for remote debugging a system on a chip (SoC), the method comprising: producing, by an intellectual property (IP) block, an event; executing, by a microcontroller, a network stack and a remote debugging program; transmitting, by the IP block to the microcontroller, information about the produced event, the transmitting performed over a fabric connecting the IP block and the microcontroller; and providing, by the microcontroller using the network stack and the remote debugging program, the information about the produced event to a device external to the SoC.

In Example 12, the subject matter of Example 11 optionally includes, wherein the IP block is a processor.

In Example 13, the subject matter of any one or more of Examples 11-12 optionally include, wherein the fabric is a sideband fabric.

In Example 14, the subject matter of any one or more of Examples 11-13 optionally include, wherein the IP block comprises: a virtual test access port (vTAP); and a functional pipeline comprising: a hardware processing module; and a register.

In Example 15, the subject matter of Example 14 optionally includes, wherein the vTAP comprises: a slave interface coupled to the fabric; a master interface coupled to the fabric and to the functional pipeline; and a decoder coupled to the slave interface and to the functional pipeline.

In Example 16, the subject matter of Example 15 optionally includes: receiving, by the slave interface, a command from the microcontroller via the fabric; transferring, by the slave interface, the command to the decoder; decoding, by the decoder, the command; transferring, by the decoder, the decoded command to the functional pipeline; executing, by the functional pipeline, the decoded command using the hardware processing module; updating, by the functional pipeline, the register in response to the execution of the decoded command; reading, by the master interface, contents of the register; generating, by the master interface based on the contents of the register; a response to the received command; and transmitting, by the master interface, the generated response to the microcontroller via the fabric.

In Example 17, the subject matter of Example 16 optionally includes, wherein the microcontroller is to receive, via the remote debugger program and the network stack, the command from the device external to the SoC.

In Example 18, the subject matter of Example 17 optionally includes: recording, by the microcontroller into a non-volatile memory: the command received from the external device; and the generated response corresponding to the received command.

In Example 19, the subject matter of any one or more of Examples 11-18 optionally include, wherein the SoC comprises: a plurality of field-programmable fuses (FPFs); wherein a respective FIT in the plurality of FPFs corresponds to a respective computing service offered by the SoC.

In Example 20, the subject matter of any one or more of Examples 11-19 optionally include, further comprising: receiving, by the microcontroller from the device external to the SoC, a respective command to destroy a respective FPF in the plurality of FPFs; and destroying, by the microcontroller, the respective FPF in the plurality of FPFs.

In Example 21, the subject matter of Example 20 optionally includes, wherein a subset of FPFs in the plurality of FPFs corresponds to a computing service offered by the SoC, the subset of FPFs having a cardinality of operational fuses, the cardinality having a parity.

In Example 22, the subject matter of Example 21 optionally includes: providing, by the SoC, the computing service only if the parity of the cardinality of the FPF subset is odd.

In Example 23, the Subject Matter of any One or More of Examples 1-22 optionally include, further comprising: authenticating, by the microcontroller using a cryptographic key, the firmware prior to executing the firmware.

Example 24 is least one machine-readable medium including instructions, which when executed by a machine, cause the machine to perform operations of any of the methods of examples 11-23.

Example 25 is an apparatus comprising means for performing any of the methods of examples 11-23.

Example 26 is an apparatus for implementing remote debugging of a system on a chip (SoC), the apparatus comprising: means for producing, by an intellectual property (IP) block, an event; means for executing, by a microcontroller, a network stack and a remote debugging program; means for transmitting, by the IP block to the microcontroller, information about the produced event, the transmitting performed over a fabric connecting the IP block and the microcontroller; and means for providing, by the microcontroller using the network stack and the remote debugging program, the information about the produced event to a device external to the SoC.

In Example 27, the subject matter of Example 26 optionally includes, wherein the IP block is a processor.

In Example 28, the subject matter of any one or more of Examples 26-27 optionally include, wherein the fabric is a sideband fabric.

In Example 29, the subject matter of any one or more of Examples 26-28 optionally include, wherein the IP block comprises: a virtual test access port (vTAP); and a functional pipeline comprising: a hardware processing module; and a register.

In Example 30, the subject matter of Example 29 optionally includes, wherein the vTAP comprises: a slave interface coupled to the fabric; a master interface coupled to the fabric and to the functional pipeline; and a decoder coupled to the slave interface and to the functional pipeline.

In Example 31, the subject matter of Example 30 optionally includes: means for receiving, by the slave interface, a command from the microcontroller via the fabric; means for transferring, by the slave interface, the command to the decoder; means for decoding, by the decoder, the command; means for transferring, by the decoder, the decoded command to the functional pipeline; means for executing, by the functional pipeline, the decoded command using the hardware processing module; means for updating, by the functional pipeline, the register in response to the execution of the decoded command; means for reading, by the master interface, contents of the register; means for generating, by the master interface based on the contents of the register; a response to the received command; and means for transmitting, by the master interface, the generated response to the microcontroller via the fabric.

In Example 32, the subject matter of Example 31 optionally includes, wherein the microcontroller is to receive, via the remote debugger program and the network stack, the command from the device external to the SoC.

In Example 33, the subject matter of Example 32 optionally includes: means for recording, by the microcontroller into a non-volatile memory: the command received from the external device; and the generated response corresponding to the received command.

In Example 34, the subject matter of any one or more of Examples 26-33 optionally include, wherein the SoC comprises: a plurality of field-programmable fuses (FPFs); wherein a respective FPF in the plurality of FPFs corresponds to a respective computing service offered by the SoC.

In Example 35, the subject matter of any one or more of Examples 26-34 optionally include: means for receiving, by the microcontroller from the device external to the SoC, a respective command to destroy a respective FPF in the plurality of FPFs; and means for destroying, by the microcontroller, the respective FPF in the plurality of FPFs.

In Example 36, the subject matter of Example 35 optionally includes, wherein a subset of FPFs in the plurality of FPFs corresponds to a computing service offered by the SoC, the subset of FPFs having a cardinality of operational fuses, the cardinality having a parity.

In Example 37, the subject matter of Example 36 optionally includes: means for providing, by the SoC, the computing service only if the parity of the cardinality of the FPF subset is odd.

In Example 38, the subject matter of Example 35 optionally includes: means for authenticating, by the microcontroller using a cryptographic key, the firmware prior to executing the firmware.

Conventional terms in the fields of computer networking and computer systems have been used herein. The terms are known in the art and are provided only as a non-limiting example for convenience purposes. Accordingly, the interpretation of the corresponding terms in the claims, unless stated otherwise, is not limited to any particular definition.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. Moreover, in the following claims, the terms "first," "second," and "third," etc. are used merely as labels, and are not intended to impose numerical requirements on their objects.

In this Detailed Description, various features may have been grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments may be combined with each other in various combinations or permutations. The scope of the embodiments should be determined with reference to the appended claims, along with the full scope of equivalents to which such claims are entitled.

The above description is intended to be illustrative, and not restrictive. For example, the above-described examples (or one or more aspects thereof) may be used in combination with each other. Other embodiments may be used, such as by one of ordinary skill in the art upon reviewing the above description.

What is claimed is:

1. A system on a chip (SoC), comprising:
    an intellectual property (IP) block to produce an event;
    a microcontroller to execute firmware comprising a network stack and a remote debugger program; and
    a fabric coupled to the microcontroller and the IP block;
    wherein the IP block is to transmit, over the fabric, information about the produced event to the microcontroller;
    wherein the microcontroller is to use the network stack and the remote debugger program to provide the information about the produced event to a device external to the SoC; and
    wherein the IP block comprises:
        a virtual test access port (vTAP); and
        a functional pipeline comprising:
            a hardware processing module; and
            a register.

2. The SoC of claim 1, wherein the IP block is a processor.

3. The SoC of claim 1, wherein the fabric is a sideband fabric.

4. The SoC of claim 1, wherein the vTAP comprises:
    a slave interface coupled to the fabric;
    a master interface coupled to the fabric and to the functional pipeline; and
    a decoder coupled to the slave interface and to the functional pipeline;
    wherein the slave interface is to:
        receive a command from the microcontroller via the fabric; and
        transfer the command to the decoder;
    wherein the decoder is to:
        decode the command; and
        transfer the decoded command to the functional pipeline;
    wherein the functional pipeline is to:
        execute the decoded command using the hardware processing module; and
        update the register in response to the execution of the decoded command; and
    wherein the master interface is to:
        read contents of the register;
        generate, based on the contents of the register, a response to the received command; and
        transmit the generated response to the microcontroller via the fabric.

5. The SoC of claim 4, wherein the microcontroller is to receive, via the remote debugger program and the network stack, the command from the device external to the SoC.

6. The SoC of claim 5, further comprising:
    a non-volatile memory, wherein the microcontroller is to record into the non-volatile memory:
        the command received from the external device; and
        the generated response corresponding to the received command.

7. The SoC of claim 1, further comprising:
    a plurality of field-programmable fuses (FPFs), wherein the microcontroller is to destroy a respective FPF in the plurality of FPFs in response to a corresponding command received by the microcontroller from the device external to the SoC;
    wherein a respective FPF in the plurality of FPFs corresponds to a respective computing service offered by the SoC; and
    wherein the SoC is to provide the respective computing service if the respective FPF is not destroyed.

8. The SoC of claim 7, wherein a subset of FPFs in the plurality of FPFs corresponds to a computing service offered by the SoC, wherein the subset of FPFs has a cardinality of operational fuses, and wherein the cardinality has a parity; and
    wherein the SoC is to provide the computing service only if the parity of the cardinality of the FPF subset is odd.

9. The SoC of claim 1, further comprising:
a cryptographic key;
wherein the microcontroller is to use the cryptographic key to authenticate the firmware prior to execution of the firmware.

10. A method for remote debugging a system on a chip (SoC), the method comprising:
producing, by an intellectual property (IP) block, an event;
executing, by a microcontroller, a network stack and a remote debugging program;
transmitting, by the IP block to the microcontroller, information about the produced event, the transmitting performed over a fabric connecting the IP block and the microcontroller; and
providing, by the microcontroller using the network stack and the remote debugging program, the information about the produced event to a device external to the SoC;
wherein the IP block comprises:
a virtual test access port (vTAP); and
a functional pipeline comprising:
a hardware processing module; and
a register.

11. The method of claim 10, wherein the IP block is a processor.

12. The method of claim 10, wherein the fabric is a sideband fabric.

13. At least one non-transitory machine-readable medium comprising instructions which, when executed by a machine, cause the machine to:
produce, by an intellectual property (IP) block, an event;
execute, by a microcontroller, a network stack and a remote debugger program;
transmit, by the IP block to the microcontroller, information about the produced event, the transmission to be performed over a fabric, the fabric connected to the IP block and to the microcontroller; and
provide, by the microcontroller through use of the network stack and the remote debugger program, the information about the produced event to a device external to the SoC;
wherein the IP block comprises:
a virtual test access port (vTAP); and
a functional pipeline comprising:
a hardware processing module; and
a register.

14. The at least one non-transitory machine-readable medium of claim 13, wherein the IP block is a processor.

15. The at least one non-transitory machine-readable medium of claim 13, wherein the fabric is a sideband fabric.

16. The at least one non-transitory machine-readable medium of claim 13, wherein the vTAP comprises:
a slave interface coupled to the fabric;
a master interface coupled to the fabric and to the functional pipeline; and
a decoder coupled to the slave interface and to the functional pipeline.

17. The at least one non-transitory machine-readable medium of claim 16, further comprising instructions which, when executed by the machine, cause the machine to:
receive, by the slave interface, a command from the microcontroller via the fabric;
transfer, by the slave interface, the command to the decoder;
decode, by the decoder, the command;
transfer, by the decoder, the decoded command to the functional pipeline;
execute, by the functional pipeline, the decoded command, the execution performed by the hardware processing module;
update, by the functional pipeline, the register in response to the execution of the decoded command;
read, by the master interface, contents of the register;
generate, by the master interface based on the contents of the register, a response to the received command; and
transmit, by the master interface, the generated response to the microcontroller via the fabric.

18. The at least one non-transitory machine-readable medium of claim 17, wherein the microcontroller is to receive, via the remote debugger program and the network stack, the command from the device external to the SoC.

19. The at least one non-transitory machine-readable medium of claim 18, further comprising instructions which, when executed by the machine, cause the machine to:
record, by the microcontroller into a non-volatile memory:
the command received from the external device; and
the generated response corresponding to the received command.

20. The at least one machine-readable medium of claim 13, wherein the SoC comprises:
a plurality of field-programmable fuses (FPFs);
wherein a respective FPF in the plurality of FPFs corresponds to a respective computing service offered by the SoC.

21. The at least one non-transitory machine-readable medium of claim 20, further comprising instructions which, when executed by the machine, cause the machine to:
receive, by the microcontroller from the device external to the SoC, a respective command to destroy a respective FPF in the plurality of FPFs; and
destroy, by the microcontroller, the respective FPF in the plurality of FPFs.

22. The at least one non-transitory machine-readable medium of claim 21, wherein a subset of FPFs in the plurality of FPFs corresponds to a computing service offered by the SoC, wherein the subset of FPFs has a cardinality of operational fuses, and wherein the cardinality has a parity.

23. The at least one non-transitory machine-readable medium of claim 22, further comprising instructions which, when executed by the machine, cause the machine to:
provide, by the SoC, the computing service only if the parity of the cardinality of the FPF subset is odd.

* * * * *

UNITED STATES PATENT AND TRADEMARK OFFICE
CERTIFICATE OF CORRECTION

PATENT NO. : 9,995,789 B2  
APPLICATION NO. : 14/977998  
DATED : June 12, 2018  
INVENTOR(S) : Dewan et al.

It is certified that error appears in the above-identified patent and that said Letters Patent is hereby corrected as shown below:

On the Title Page

Item (54) and in the Specification, in Column 1, Line 1, in "Title", delete "SOCS" and insert --SoCs-- therefor Signed and Sealed this
Fourth Day of June, 2019

Andrei Iancu
*Director of the United States Patent and Trademark Office*